(12) United States Patent
Wiesbauer et al.

(10) Patent No.: US 11,381,923 B2
(45) Date of Patent: Jul. 5, 2022

(54) MEMS TRANSDUCER AND METHOD FOR OPERATING THE SAME

(71) Applicant: Infineon Technologies AG, Neubiberg (DE)

(72) Inventors: Andreas Wiesbauer, Poertschach (AT); Pedro Augusto Borrego Lambin Torres Amaral, Villach (AT); Alessandro Caspani, Villach (AT); Niccoló De Milleri, Villach (AT); Marc Fueldner, Neubiberg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 154 days.

(21) Appl. No.: 16/884,816

(22) Filed: May 27, 2020

(65) Prior Publication Data

US 2021/0029469 A1 Jan. 28, 2021

(30) Foreign Application Priority Data

Jul. 25, 2019 (EP) .................................... 19188419

(51) Int. Cl.
*H04R 19/04* (2006.01)
*H03F 3/45* (2006.01)

(52) U.S. Cl.
CPC .............. *H04R 19/04* (2013.01); *H03F 3/45* (2013.01); *H04R 2201/003* (2013.01)

(58) Field of Classification Search
CPC ......... H03F 3/45; H04R 19/005; H04R 19/04; H04R 2201/003; H04R 2410/03; H04R 3/005; H04R 3/06

(Continued)

(56) References Cited

U.S. PATENT DOCUMENTS

| | | | |
|---|---|---|---|
| 2015/0001647 A1* | 1/2015 | Dehe | H04R 31/00 257/416 |
| 2015/0125003 A1* | 5/2015 | Wiesbauer | H04R 19/005 381/111 |

(Continued)

FOREIGN PATENT DOCUMENTS

CN 202488706 U 10/2012

OTHER PUBLICATIONS

Wang, Zhe et al., "The Era of Silicon MEMS Microphone and Look Beyond", IEEE Transducers, Anchorage, Alaska, Jun. 21-25, 2015, 4 pages.

*Primary Examiner* — Alexander Krzystan
*Assistant Examiner* — Julie X Dang
(74) *Attorney, Agent, or Firm* — Slater Matsil, LLP

(57) ABSTRACT

A MEMS transducer includes a first and a second differential MEMS sensor device. The first differential MEMS sensor device includes a first and a second electrode structure for providing a first differential output signal, and a third electrode structure between the first and second electrode structure. The second differential MEMS sensor device includes a first and second electrode structure for providing a second differential output signal, and a third electrode structure between the first and second electrode structure. A biasing circuit provides the third electrode structure of the first differential MEMS sensor device with a first biasing voltage and provides the third electrode structure of the second differential MEMS sensor device with a second biasing voltage. A read-out circuitry combines the first and second differential output signal in an anti-parallel manner.

20 Claims, 10 Drawing Sheets

(58) Field of Classification Search
USPC .......................................................... 381/355
See application file for complete search history.

(56) References Cited

U.S. PATENT DOCUMENTS

| | | | | |
|---|---|---|---|---|
| 2015/0358708 A1* | 12/2015 | Axelsson | ............. | H04R 1/1083 |
| | | | | 381/71.7 |
| 2016/0150325 A1* | 5/2016 | Oliaei | .................... | H04R 3/005 |
| | | | | 381/111 |
| 2020/0252728 A1* | 8/2020 | Niederberger | ......... | H04R 3/005 |

* cited by examiner

Providing a MEMS sensor arrangement — 110

Providing a bias voltage to each of the third electrode structures of the first and second differential MEMS sensor device, wherein the first and second bias voltages are symmetrically offset with respect to a, in particular common, reference voltage — 120

Reading out a first differential and second differential output signal — 130

Combining anti-parallel the first and the second differential output signal by connecting a first output tap of the first differential MEMS sensor device and a second output tap of the second differential MEMS sensor device, and by connecting a second output tap of the first differential MEMS sensor device and a first output tap of the second differential MEMS sensor device — 140

Fig. 10

MEMS TRANSDUCER AND METHOD FOR OPERATING THE SAME

This application claims the benefit of European Patent Application No. 19188419, filed on Jul. 25, 2019, which application is hereby incorporated herein by reference.

TECHNICAL FIELD

The present disclosure relates generally to an electronic device, and, in particular embodiments, to a MEMS transducer and method for operating the MEMS transducer. A MEMS transducer converts energy from one form to another. Common examples of MEMS transducers, in particular differential MEMS transducers, include microphones, loudspeakers, position and pressure sensors. The acronym MEMS is short for Micro-Electro-Mechanical System.

BACKGROUND

Audio microphones are commonly used in a variety of consumer applications such as cellular telephones, digital audio recorders, personal computers and teleconferencing systems. When designing capacitive MEMS devices, e.g. sound transducers, pressure sensors, acceleration sensors, microphones or loudspeakers, it may be typically desirable to achieve a high signal-to-noise ratio (SNR) of the transducer output signal. The continuous miniaturization of transducers may pose new challenges with respect to the desired high signal-to-noise ratio. MEMS microphones and to the same extent also MEMS loudspeakers which may be used in, for example, mobile phones, laptops, and similar (mobile or stationary) devices, may nowadays be implemented as semiconductor (silicon) microphones or microelectromechanical systems (MEMS). In order to be competitive and to provide the expected performance, high performance silicon microphones are required to achieve both acoustical performance (Signal-to-Noise Ratio and Total Harmonic Distortion), as well as robustness to the external environment. As such, an assembly of two or more individual microphones can be assembled to achieve both higher performances and robustness, as well as better shock recovery than a large individual microphone.

In applications where MEMS microphones are implemented in small form factor packages, such as smartphones or tablet computers, the MEMS microphone is typically coupled to an integrated circuit that biases the MEMS microphone, amplifies the output of the MEMS microphone, and performs an analog-to-digital conversion on the electrical output of the MEMS microphone. During a fabrication of a MEMS device, small asymmetries in the distance between a central stator and membranes or electrodes sandwiching the stator may arise, which may affect the signal-to-noise ratio and the total harmonic distortion. However, high performance microphones are required having both an improved acoustical performance as well as an improved robustness to the external environment.

Generally, there is a need in the art for an approach to implement an improved MEMS sensing device such as a MEMS microphone having reduced susceptibility to failure and providing an improved SNR.

Such a need can be solved by the MEMS transducer according to claim 1, by the acoustic sensing device according to claim 11, and by the method of operating the MEMS transducer according to claim 13.

SUMMARY

In accordance with an embodiment, a MEMS transducer comprises at least a pair of differential MEMS sensor devices. The pair of differential MEMS sensor devices comprises a first and a second differential MEMS sensor device. The first differential MEMS sensor device comprises a first and a second electrode structure for providing a first differential output signal. A third electrode structure is provided between the first and second electrode structure. A biasing circuit is provided for supplying the third electrode structure of the first differential MEMS sensor device with a first biasing voltage and for providing the third electrode structure of the second differential MEMS sensor device with a second biasing voltage, wherein the first and second biasing voltages are symmetrically offset with respect to a reference voltage. A read-out circuitry is configured to combine the first and second differential output signal in an anti-parallel manner. By providing two differential MEMS sensor devices, in particular essentially equally constructed, in an anti-parallel configuration a twin MEMS transducer is introduced. By operating at least two differential MEMS sensor devices as a twin MEMS transducer having an anti-parallel configuration, it was found that the acoustical performance as well as the robustness to the external environment is improved. In accordance with a further embodiment, an acoustic sensing device comprises: a housing; a sound port having a sound port inlet for letting pass sound waves to an interior of the acoustic sensing device; and a MEMS transducer disclosed herein. In accordance with a further embodiment, a method of operating the MEMS transducer disclosed herein comprises: providing a biasing voltage to each of the third electrode structures of the first and second differential MEMS sensor devices, wherein the first and second biasing voltages are symmetrically offset with respect to a, in particular common, reference voltage. The method further comprises reading out a first differential and second differential output signal by connecting a first output tap of the first differential MEMS sensor device and a second output tap of the second differential MEMS sensor device, and by connecting a second output tap of the first differential MEMS sensor device and a first output tap of the second differential MEMS sensor device; and combining anti-parallel the first and the second differential output signal.

BRIEF DESCRIPTION OF THE DRAWINGS

For a more complete understanding of the present embodiments, and the technical effects resulting thereof, reference is now made to the following description taken in conjunction with the accompanying drawings, in which:

FIG. 10 illustrates a flowchart of an embodiment method of operating a twin MEMS device.

DETAILED DESCRIPTION OF ILLUSTRATIVE EMBODIMENTS

In the following description, embodiments are discussed in detail, however, it should be appreciated that the embodiments provide many applicable concepts that can be embodied in a wide variety of semiconductor devices. The specific embodiments discussed are merely illustrative of specific ways to make and use the present concept, and do not limit the scope of the embodiments. In the following description of embodiments, the same or similar elements having the same function have associated therewith the same reference signs or the same name, and a description of such elements will not be repeated for every embodiment. Moreover, features of the different embodiments described hereinafter may be combined with each other, unless specifically noted otherwise.

It is understood that when an element is referred to as being "connected" or "coupled" to another element, it may be directly connected or coupled to the other element, or intermediate elements may be present. Conversely, when an element is referred to as being "directly" connected to another element, "connected" or "coupled," there are no intermediate elements. Other terms used to describe the relationship between elements should be construed in a similar fashion (e.g., "between" versus "directly between", "adjacent" versus "directly adjacent", and "on" versus "directly on", etc.).

Figure 1:
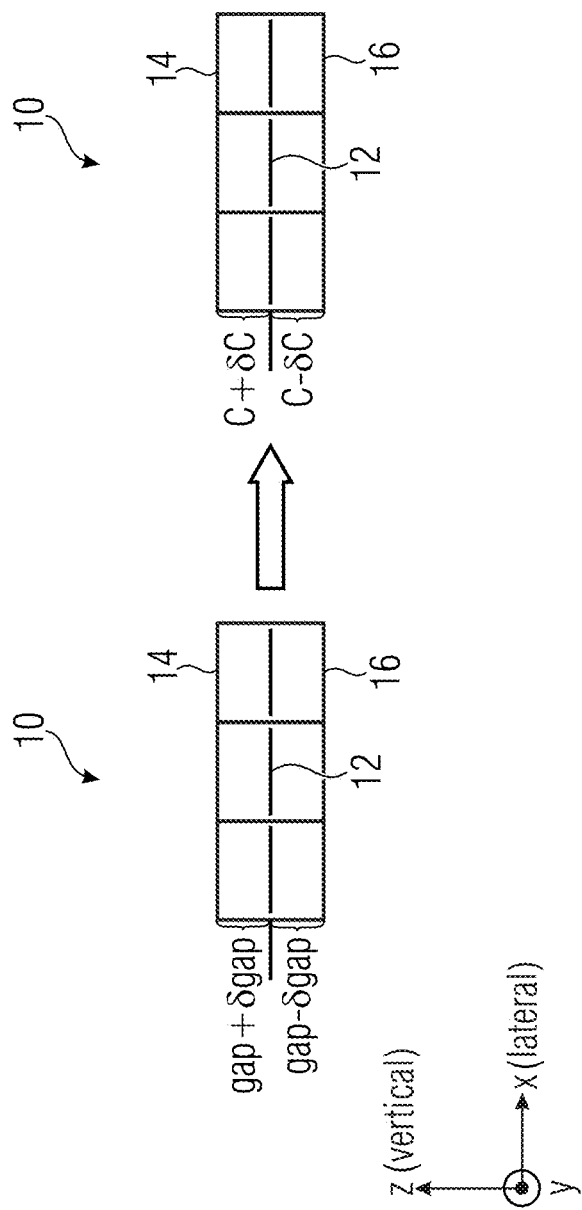
FIG. 1 illustrates a schematic representing a translation of gap asymmetries into capacitance asymmetries.
Figure 2:
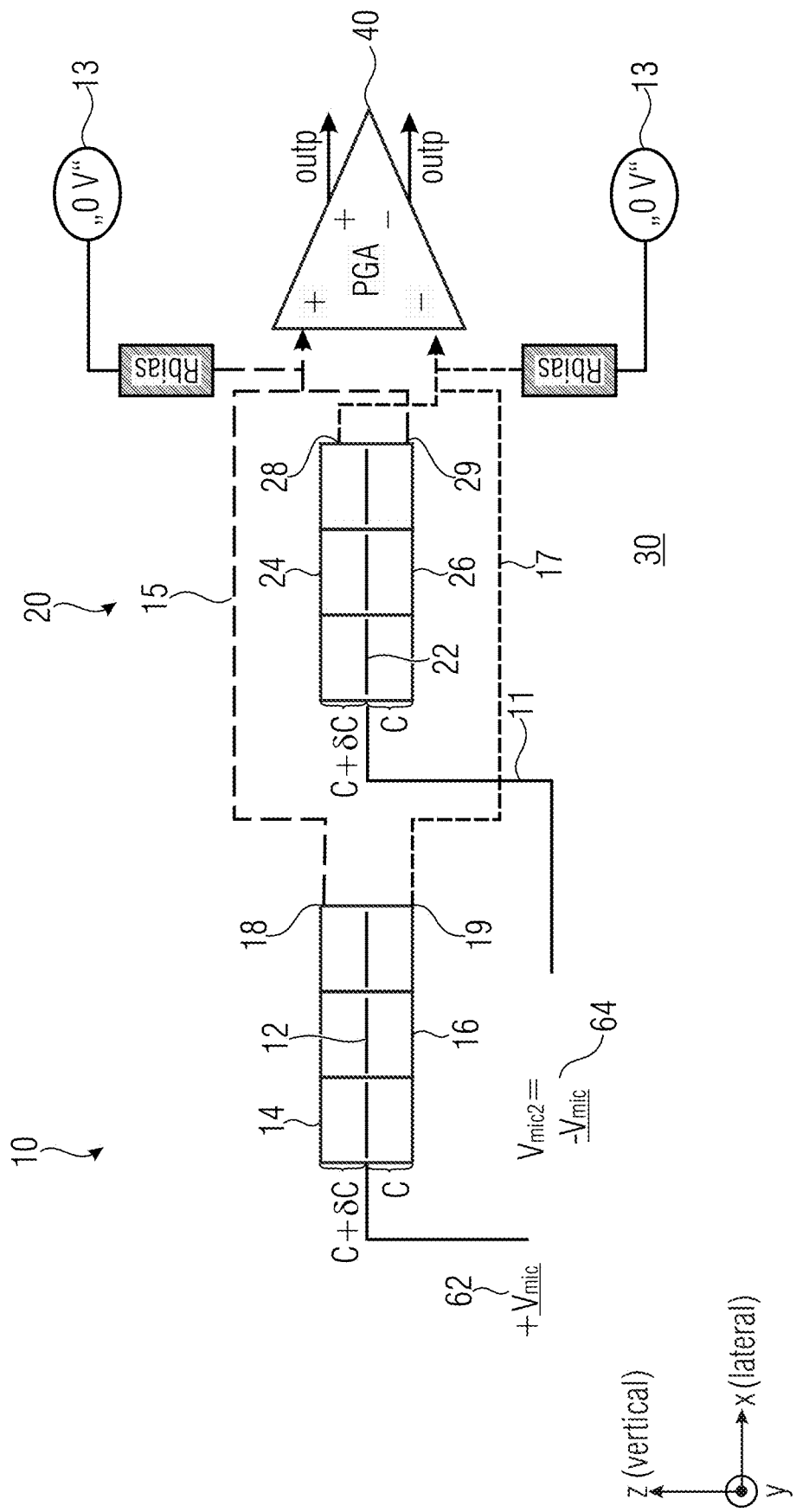
FIG. 2 illustrates a schematic of two differential MEMS sensor devices coupled in anti-parallel to a programmable gain amplifier PGA.
Figure 3:
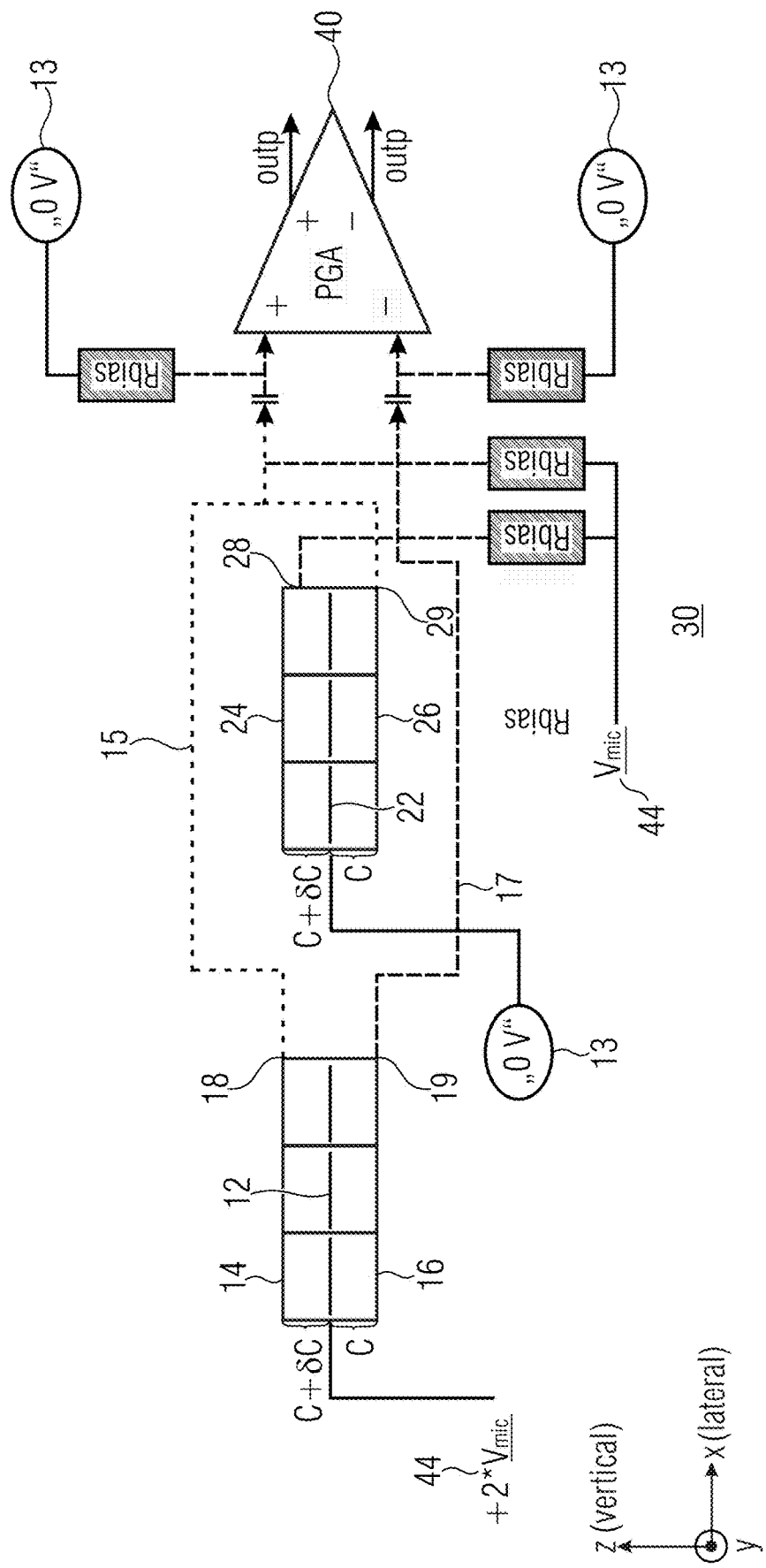
FIG. 3 illustrates a schematic of two differential MEMS sensor devices coupled in anti-parallel to a programmable gain amplifier PGA.

For facilitating the description of the different embodiments, FIGS. 1-3 comprise a Cartesian coordinate system x, y, z, wherein the x-y-plane corresponds, i.e. is parallel, to the first main surface region of the MEMS sensor device (=first or second or third electrode structure), and wherein the direction perpendicular to the first main surface region corresponds to the "z" direction, i.e. is parallel to the z direction. In the following disclosure, the term "lateral" is to be understood as a direction parallel to the x- or y-direction, and the term "vertical" is to be understood a direction parallel to the z-direction.

The making and using of embodiments of the herein described MEMS transducer, in particular of the differential transducer, are discussed in detail below. It should be appreciated, however, that the present disclosure provides many applicable aspects that can be embodied in a wide variety of specific contexts. The specific embodiments discussed are merely illustrative of specific ways to make and use the aspects of the present disclosure and do not limit the scope of the disclosure.

The present aspects of the disclosure will be described with respect to embodiments in a specific context, namely a MEMS transducer, an acoustic sensing device comprising the MEMS transducer and a method for operating the MEMS transducer. The MEMS transducer may be provided as a differential MEMS microphone, or as a loudspeaker, or as capacitive sensors such as pressure sensors and accelerometers. The present disclosure may also be applied, however, to other types of MEMS devices and systems where an electrical or physical quantity can be—sensed as or converted in—a differential signal, such as audio systems, communication systems, and sensor systems. The differential signal is given by a potential difference sensed at a tap of a circuit.

During a fabrication of a differential MEMS sensor device, small asymmetries in the distance between a central electrode structure, which can be a backplate or a flexible membrane, and electrode structures, which can be membranes or backplates, sandwiching the central electrode structure may arise, which may affect the performance of the differential MEMS sensor device. FIG. 1 illustrates a schematic representing a translation of gap asymmetries into capacitance asymmetries in a MEMS device 10.

The MEMS transducer, in particular the differential transducer, disclosed may be embodied by a double backplate configuration or by a double membrane configuration. The double backplate configuration comprises a central membrane sandwiched between two backplates. A first differential read-out may be sensed between the membrane and first backplate and a second differential readout may be sensed between the membrane and the second backplate. The double membrane configuration comprises a central backplate sandwiched between two (mechanically coupled) membranes. A first differential read-out may be sensed between the first membrane and the central backplate and a second differential read-out may be sensed between the second membrane and the backplate.

In order to comprise both, the double membrane and the double backplate configuration, by the present disclosure, the differential MEMS sensor device is described using the wording of electrode structures, wherein the third electrode structure is described as being the central backplate or the central membrane. The embodiments of the present disclosure will be discussed in more detail with reference to FIGS. 1-10.

The differential MEMS sensor device 10 illustrated in FIG. 1 comprises a third electrode structure 12 which is sandwiched in a distance apart from the third electrode structure 12 by a first and second electrode structure 14, 16. During fabrication of the MEMS device, however, small asymmetries may develop. The small asymmetries affect the performance quality a differential MEMS sensor device. For example, on a given wafer, the distance from the central stator to a top membrane, which may be with respect to FIG. 1 the distance (gap+Δgap) from the third electrode structure 12 to the first electrode structure 14 for example, is larger than the distance (gap+Δgap) from the third electrode structure 12 to the second electrode structure 16. This issue may be expressed by the inequation (called herein gap asymmetry):

$$gap+\Delta gap > gap-\Delta gap,$$

wherein the variable gap is given by a desired distance between the third electrode structure and one of the first or second electrode structure and the variable Δgap defines the positional deviation of the first or second electrode structure, i.e. the positional deviation describes a difference between the actual physical electrode structure position and an exact theoretical electrode structure position. The gap extends along the vertical direction, i.e. along the z-direction when considering a set-up as illustrated in one of FIGS. 1-3. The exact electrode structure positions are often not realizable due to manufacturing errors. The manufacturing errors may create an asymmetry in the capacitance C±ΔC as illustrated in FIG. 1. The resulting capacitance asymmetry may be expressed by $$C+\Delta C \neq C-\Delta C.$$

Here, C defines a capacitance between the third electrode structure and one of the first or second electrode structure, and ΔC defines an additional capacitance originating from the positional deviation of the first or second electrode structure. The additional capacitance may be positive with respect to the third electrode structure and one of the first or second electrode structure. The inequation of the capacitance asymmetry expresses that while the additional capacitance is added to the capacitance C defined by the third electrode structure and one of the first or second electrode structure, the additional capacitance is subtracted from the capacitance C defined by the third electrode structure and one of the other second or first electrode structure. Such a capacitance asymmetry can reach 10% or even more which may be sensed at a tap of the differential MEMS sensor device. This in turn may result in no cancelation of systematic capacitance asymmetries, in particular if the differential MEMS sensor device is applied to differential sensors. The capacitance asymmetry may create undesirable effects, for example a degraded output electrical asymmetry, a distortion of the outputted signal or effects with regard to a shock recovery. With the term "shock recovery", a situation is meant in which the MEMS device is exposed to a mechanical influence, for example a finger tap on the MEMS device.

In order to overcome arising capacitance asymmetries resulting in the just mentioned undesired effect, a MEMS transducer comprising at least one twin MEMS sensor device is proposed. The at least one twin MEMS sensor device comprises at least a pair of differential MEMS sensor devices being coupled to each other in an anti-parallel configuration. By providing the differential MEMS sensor devices in an arrangement of pairs of two differential MEMS sensor devices coupled in an anti-parallel manner, it was found that the signal asymmetry originating from the asymmetric capacitance of the MEMS devices is reduced. This results in an improved performance quality and improved robustness of the MEMS transducer.

In embodiments of the present disclosure, a MEMS transducer 30 comprises at least one pair of differential MEMS sensor devices 10, 20. The pair of differential MEMS sensor devices 10, 20 comprises a first and a second differential MEMS sensor device 10, 20. The first differential MEMS sensor device 10 comprises a first and a second electrode structure 14, 16 for providing a first differential output signal, and a third electrode structure 12 between the first and second electrode structure 14, 16. The second differential MEMS sensor device 20 comprises a first and second electrode structure 24, 26 for providing a second differential output signal, and a third electrode structure 22 between the first and second electrode structure 24, 26. A biasing circuit 11 for providing the third electrode structure 12 of the first differential MEMS sensor device 10 with a first biasing voltage $V_{mic}$, and for providing the third electrode structure 22 of the second differential MEMS sensor device 20 with a second biasing voltage $V_{mic2}$, in that the first and second biasing voltages $V_{mic}$, $V_{mic2}$ are symmetrically offset with respect to a reference voltage. A read-out circuitry 15, 17, 40 is configured to combine the first and second differential output signal in an anti-parallel manner. The anti-parallel combination results in a reduced signal asymmetry and therewith in an improved performance of the MEMS transducer. Such embodiments are schematically shown in FIGS. 2 and 3, for example.

In embodiments of the present disclosure, the MEMS transducer 30 comprises a dual membrane configuration, wherein the first electrode structure 14, 24 is a first membrane and the second electrode structure 16, 26 is a second membrane, and wherein the third electrode structure 12, 22 is a backplate. Such an embodiment may be realized in high performance silicon microphones, for example. High performance silicon microphones are required to achieve both acoustical performance and a robustness to the external environment. The signal-to-noise ratio and a total harmonic distortion may be understood under the term "acoustical performance". By providing the MEMS transducer 30 with an anti-parallel read-out configuration as proposed herein, a high acoustical performance and a high robustness is achieved.

In embodiments of the present disclosure, the MEMS transducer comprises a dual backplate configuration, wherein the first electrode structure 14, 24 is a first backplate and the second electrode structure 16, 26 is a second backplate, and wherein the third electrode structure 12, 22 is a membrane. The membrane may be flexible and is disposed between the two backplates. Therewith a dual capacitive construction of a MEMS device is provided providing two symmetrical phase shifted signals when the membrane is moving in sound. Such an embodiment may be realized in a dual backplate silicon MEMS microphone, for example. Dual backplate silicon MEMS microphones are applied, for example, in smartphones requiring a high signal-to-noise ratio for high audio quality and speech recognition.

In embodiments of the present disclosure, the first and the second differential MEMS sensor devices 10, 20 of the proposed MEMS transducer 30 are identically constructed apart from manufacturing deviations, and wherein the first and the second differential MEMS sensor devices 10, 20 are arranged in a twin configuration. The construction of the MEMS sensor devices may differ slightly from each other because of manufacturing deviations, which may arise during the manufacture process of a single differential MEMS sensor device 10, 20. For example, the manufacturing process may comprise the steps of depositing a membrane, formation of an air gap, depositing electrode structures, etching and/or metallization. During the manufacturing steps, the accuracy of each manufacturing step may be failed slightly resulting in manufacturing deviations. Under the term "twin configuration", a pairing of two individual differential MEMS sensor devices is to be understood.

In embodiments of the present disclosure, the first differential output signal is provided between a first and a second output tap 18, 19 of the first differential MEMS sensor device 10 and the second differential output signal is provided between a first and a second output tap 28, 29 of the second differential MEMS sensor device 20. The first output tap 18 of the first differential MEMS sensor 10 is connected with the first electrode structure 14 of the first differential MEMS sensor device 10, and the second output tap 19 of the first differential MEMS sensor device 10 is connected with the second electrode structure 16 of the first differential MEMS sensor device 10. The first output tap 19 of the second differential MEMS sensor device 20 is connected with the first electrode structure 24 of the second differential MEMS sensor device 20, and the second output tap 28 of the second differential MEMS sensor device 20 is connected with the second electrode structure 26 of the second differential MEMS sensor device 20. A read out of a combined first and second differential output signal is provided by an anti-parallel connection 15, 17 of the first and second output taps 18, 19, 28, and 29 of the first and second differential MEMS sensors 10, 20. As for example illustrated in FIGS. 2 and 3, the anti-parallel connection 15, 17 of the twin MEMS transducer 30, i.e. between the first and the second MEMS sensor devices, among others allows for an anti-parallel read out of signals. By reading out the signals in anti-parallel it was found the capacitance asymmetries could be cancelled resulting in an improved performance of the MEMS devices.

In embodiments of the present disclosure, the anti-parallel combination of the first and the second differential output signal comprises connecting the first output tap 18 of the first differential MEMS sensor device 10 and the second output tap 29 of the second differential MEMS sensor device 20, and comprises connecting the second output tap 19 of the first differential MEMS sensor device 10 and the first output tap 28 of the second differential MEMS sensor device 20. Stated differently, combining anti-parallel the first and the second differential output signal is called herein an antiparallel connection 15, 17 which corresponds to cross-connecting the output taps of the first and second MEMS sensor devices. Such a cross-connection or anti-parallel connection is shown in FIGS. 2 and 3 schematically by the reference signs 15, 17. The anti-parallel connection 15, 17 form together with a programmable gain amplifier 40 the read out circuitry 15, 17 40 for reading out the signal of each of the MEMS sensor devices 10, 20 of the MEMS transducer 30.

In embodiments of the present disclosure, the first biasing voltage $V_{mic}$ is a positive voltage, and the second biasing voltage $V_{mic2}$ is a negative voltage, wherein the first and the second biasing voltages $V_{mic}$, $V_{mic2}$ are having the same absolute voltage value, and the reference voltage is a ground voltage. The second biasing voltage source is an additional biasing voltage which is required to read out the twin MEMS transducer 30 in anti-parallel configuration. The additional second biasing voltage $V_{mic2}$ may be symmetric to the first biasing voltage $V_{mic}$, which can be expressed by the relation: $|+V_{mic}|=|-V_{mic2}|$. By providing the biasing voltages as proposed, the systematic capacitance asymmetries are reduced, in particular they can be cancelled. This improves the output asymmetry, also referred herein to as the signal asymmetry, and improves a shock recovery behavior.

For example, each of the first and the second MEMS sensor devices 10, 20 is provided with a bias voltage source 62, 64, wherein each of the bias voltage sources 62, 64 is designed to provide, in operation, a bias voltage that is essentially adapted to the bias voltage of the other MEMS device. For example, the bias voltage sources 62, 64 may be configured to provide, in operation, bias voltages that are adapted to each other, except for up to ±0.25 V, ±0.5 V or ±1.0 V. Stated differently, bias voltages provided by the bias sources 62, 64 and having a voltage offset with respect to one another of up to ±0.25 V, ±0.5 V or ±1.0 V are essentially considered to be "adapted to each other" within the meaning of this disclosure. In yet other words, within the present disclosure, the term "adapted to each other" may be understood as substantially symmetrical absolute voltage values with respect to a reference voltage 13.

In embodiments of the present disclosure, one of the bias voltage sources 62, 64 is a stacked bias voltage source 44 having an AC coupling, in particular the stacked bias voltage source 44 having an AC coupling is configured to provide positive first biasing voltage $V_{mic}$ and a positive second biasing voltage $V_{mic2}$, wherein the first and second bias voltages $V_{mic}$, $V_{mic2}$ are symmetric with respect to a positive reference voltage $V_{ref}$. The reference voltage $V_{ref}$ is for example zero, as indicated in FIG. 3. By using a stacked bias voltage source 44 having an AC coupling allows to waive generating a negative voltage, i.e. there is no need to generate negative voltages.

In embodiments of the present disclosure, the read out circuitry 15, 17, 40 comprises a programmable gain amplifier (PGA) 40 designed for amplifying the combined anti-parallel signal. The realization of the proposed transducer with a PGA is, for example, shown schematically in FIGS. 2 and 3. For example, it is possible to use an application-specific integrated circuit, ASIC for the read out circuitry. The implementation of the proposed MEMS arrangement 30 with an ASIC is, for example, shown in FIG. 4.

In embodiments of the present disclosure, two or more pairs of differential MEMS sensor devices 10, 20 coupled in a twin configuration are coupled with each other in an anti-parallel manner (not shown in the figure), and are configured for providing a sensor output signal having a reduced signal asymmetry resulting from capacitance asymmetries of the first and second differential MEMS sensor device 10, 20. The embodiments shown in FIGS. 2 and 3, where one pair of two differential MEMS sensor devices coupled in an anti-parallel configuration is shown, can be extended easily to have two or more pairs of twin MEMS devices. For example, the MEMS transducer may comprise four pairs of twin MEMS sensor devices being coupled in anti-parallel providing a high performance of the MEMS transducer. By coupling two or more pairs of differential MEMS sensor devices, a shock recovery of, in particular large, signals having a large amplitude are improved.

As already indicated, FIG. 2 illustrates a schematic of a first embodiments of the proposed twin MEMS device 30, wherein the first MEMS device 10 and the second MEMS device 20 are coupled in an anti-parallel configuration to a programmable gain amplifier PGA 40. The first MEMS 10 is provided with the third electrode structure 12, being for example also called a stator, and two further electrode structures 14, 16 surrounding the stator 12. The second MEMS 20 is provided with the third electrode structure 22, for example being also called a stator 22, and two further electrode structures 24, 26, for example the first membrane 24 and second membrane 26. A sound wave may impinge onto the first electrodes structures 14, 24, being for examples first membranes 14, 24, of the first and the second MEMS 10, 20 or may impinge onto the second electrode structures 16, 26, for examples being second membranes 16, 26, of the first and second MEMS. The impinging of a sound wave onto the first membranes 14, 24 or onto the second membranes 16, 26 results in a deflection of the membranes 14, 24, 16, 26 with respect to the stators 12, 22. Within this disclosure, the impinging of a sound wave onto the first or second membranes, defines a deflection direction of the membranes so that a detectable differential signal may result. Each of the stators 12, 22 is coupled to a bias voltage source 62, 64. As shown in FIG. 2 the first stator 12 of the first MEMS device 10 is coupled to a first bias voltage source 61 which is designed to supply in operation a bias voltage to the first stator 12. As also shown in FIG. 2, the second stator 22 of the second MEMS device 20 is coupled to a second bias voltages source 62. The bias voltage sources 61, 62 may apply a voltage of, for example, +9 V and −9V or +12 V and −12 V or any other positive and corresponding negative voltage value. Stated differently, the bias voltage sources 61, 62 of a first embodiment as shown in FIG. 2 provide a bias voltage which is essentially symmetric to each other. The term "symmetric with respect to the bias voltages sources" means that one of the bias voltage source provides a positive voltage $+V_{mic}$ while the other bias voltage source provides a negative voltage $-V_{mic}$ of essentially the same absolute value apart from a voltage error. The bias voltage $V_{mic}$ may be supplied from a DC voltage source, for example. Thus, for reading out the signal, one of the differential MEMS sensor devices needs to be connected to a symmetric bias voltage that fulfills the condition:

$$|+V_{mic}|\approx|-V_{mic}|.$$

It has been found out by the inventors that the cancellation of asymmetries does not depend significantly on the exact value of $-V_{mic}$. Instead, a proportionality between $-V_{mic}$ and $+V_{mic}$ is sufficient to cancel a signal asymmetry.

As already indicated above with reference to the definition of a double membrane configuration, the electrode structures 14, 16, 24, 26 act as electrodes and may be designed as membranes, wherein the electrode structures 12, 22 act as counter electrodes and may be designed as a backplate. In such a case, the deflection of the membranes results in a change of distance between the third electrode structure 12, 22 and the membranes which in turn results in a detectable differential signal. As shown in FIG. 2, for example, the differential signal may be outputted at a programmable gain amplifier PGA 40. As shown in FIG. 2, the first membrane 14 of the first MEMS 10 is electrically coupled with the second membrane 24 of the second MEMS 20. Also shown is, that the second membrane 16 of the first MEMS 10 is electrically coupled the first membrane 26 of the second MEMS 20. The electrical coupling is indicated by the dashed lines 15, 17. FIG. 2 shows a coupling of two differential MEMS sensor devices 10, 20 in an anti-parallel configuration which is proposed by the present disclosure.

Within this disclosure, with the term "a coupling in an anti-parallel manner" of the twin MEMS device, it is meant that one of the first electrode structure 14, 24 of one of the differential MEMS sensor devices 10, 20 is electrically coupled with second electrode structure 16, 26 of the other differential MEMS sensor device 10, 20, as indicated via the dashed lines 15, 17. As a sound wave impinges the first or the second electrode structures firstly, the interconnection of the first and the second differential MEMS sensor devices of the proposed twin MEMS device results in an anti-parallel read out of the first and second MEMS device of the twin MEMS device. Due to the coupling in an anti-parallel manner, i.e. due to the anti-parallel configuration, a MEMS capacitance asymmetry may be canceled or reduced. Such a MEMS capacitance asymmetry may arise due to fabrication errors as described. A fabrication error may cause small asymmetries in the distance between the central electrode structure and each of the first and second electrode structures of a differential MEMS sensor device.

As already indicated, FIG. 3 illustrates a schematic of a second embodiments of the proposed twin MEMS transducer 30, wherein the first MEMS device 10 and the second MEMS device 20 are coupled in an anti-parallel configuration to a programmable gain amplifier PGA 40. Similar to the first embodiment shown in FIG. 2, the first electrode structure 12, 24 or first membrane 14, 24 of one MEMS device 10, 20 is coupled to the second electrode structure 16, 26 or second membrane 16, 26 of the other MEMS device 10, 20. By this, the anti-parallel configuration is realized. The second embodiment shown in FIG. 3 differs from the first embodiment shown in FIG. 2 in that a stacked bias voltage source with an AC coupling at the PGA input 40 is used. By using the stacked biasing voltage, there is no need to generate a negative voltage. The stacked bias voltage source is provided with a AC coupling so that a the second differential MEMS sensor device 20 may be supplied with a zero voltage and the first MEMS device 10 may be supplied with twice a positive voltage $+2*V_{mic}$. By providing a stacked biasing voltage source 44, both third electrode structures 12, 22 may be supplied with a positive voltage, for example with a voltage of 0V and +20 V, instead of −10V and +10 V or for example 0V and +30 V instead of −15 V and +15 V or the like when using a symmetric bias voltage source as discussed for the first embodiment with reference to FIG. 2. If a stacked bias voltage source 44 is used, one of the third electrode structure may be provided with a reference potential 13. The reference potential 13 may be given by 0V or any other voltage value.

Figure 4:
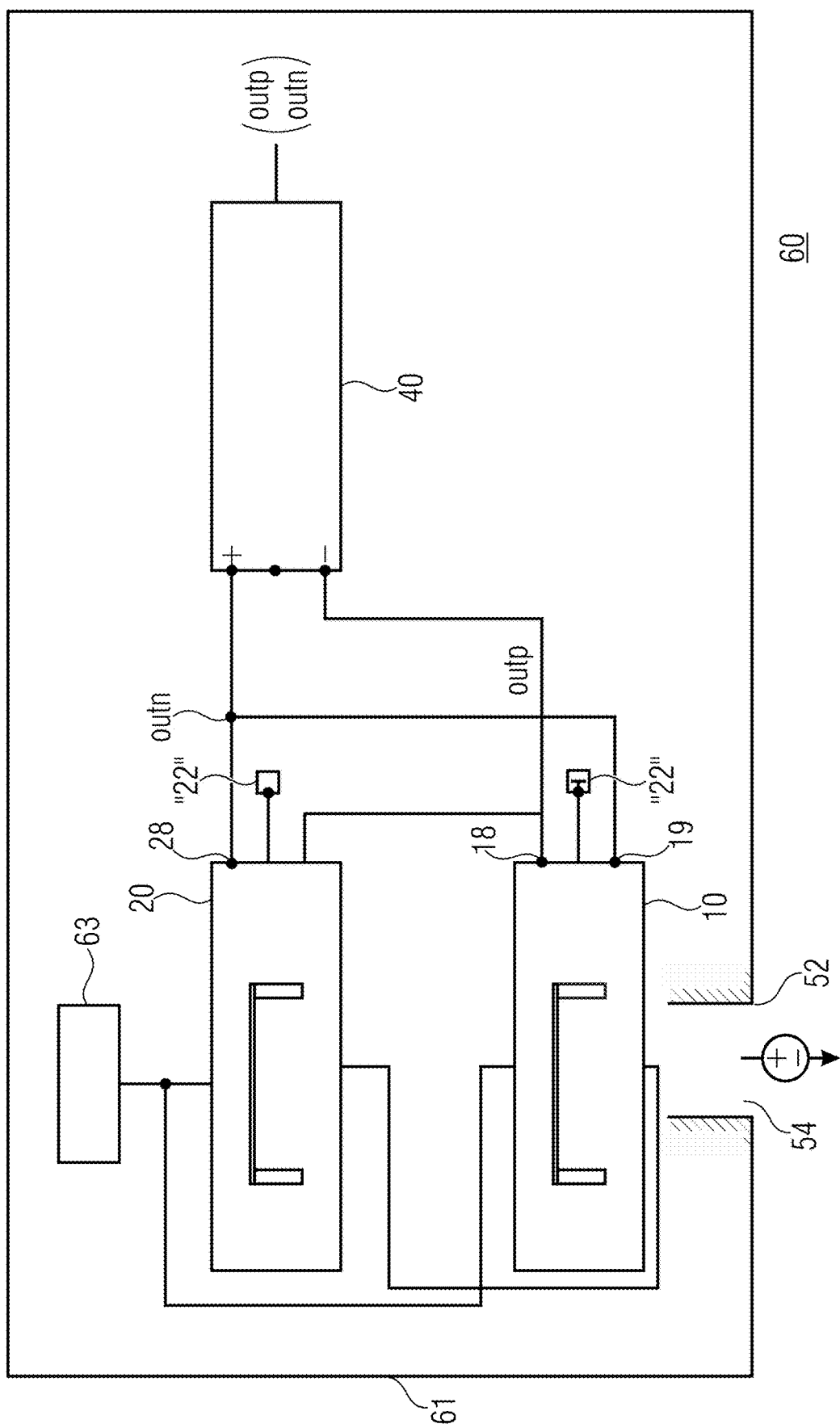
FIG. 4 illustrates a schematic set up of a microphone bring illustrated as a circuit diagram used for simulating a readout of two differential MEMS sensor devices being coupled in anti-parallel.

According to a further aspect of the embodiments of the present disclosure, an acoustic sensing device 60 comprises a housing 61; a sound port 52 having a sound port inlet 54 for letting pass sound waves to an interior of the acoustic sensing device 60; and a MEMS transducer as disclosed herein. In an example, the acoustic sensing device may further comprise a substrate coupled to the housing 61 in the interior; an integrated circuit positioned onto the substrate; and two or more pairs of differential MEMS sensor devices 10, 20 coupled in a twin configuration. The two or more pairs of differential MEMS sensor devices 10, 20 are coupled in an anti-parallel manner onto the substrate and are designed for receiving the sound waves, wherein the one or more pairs of differential MEMS sensor devices 10, 20 are designed according to the MEMS transducer 30 as described herein. FIG. 4 illustrates a circuit diagram of such the acoustic sensing device 60 which may be embodied by a microphone 60 for example. The acoustic sensing device 60 may be created using a dual membrane or a dual backplate set-up having the anti-parallel configuration of the twin MEMS transducer 30. According to the illustration of FIG. 4 the acoustic sensing device 60 or the microphone 60 is provided with an ASIC 40 instead of a PGA 40 as shown in FIGS. 2 and 3. The ASIC may be constructed as required for operating the microphone 60 and will not be discussed in detail.

In embodiments of the acoustic sensing device, at least one pair of the one or more pairs of differential MEMS sensor devices is a pair of MEMS acoustic transducers, for example microphones or loudspeakers. Thus, the acoustic sensing device may be configured to function as a microphone. The acoustic sensing device, in particular the microphone, disclosed herein is for converting sound waves into an electrical differential signal, which may be measured. The measured electrical signal may be amplified by using a converter as for example described herein. For the sake of simplicity the acoustic sensing device is described as an acoustic transducer, for example a microphone, comprising the twin differential MEMS sensor devices in the following.

The schematic set up of an acoustic sensing device 60, in particular a microphone 60, illustrated in FIG. 4 is used for simulating a readout of a MEMS transducer 30 which comprises two differential MEMS sensor devices coupled in an anti-parallel manner. As shown in FIG. 4 a tap of first membrane 18 of the first differential MEMS sensor device 10 is coupled to a tap of the second membrane 29 of the second differential MEMS sensor device 20 and a tap of the second membrane 19 of the first differential MEMS sensor device 10 is coupled to the tap of the first membrane 28 of the second differential MEMS device. The reference signs "12", "22" in quotation marks refer each to the tap of the corresponding third electrode structure 12, 22, because FIG. 4 does not show the electrode structures as such, but their taps. Stated differently, an anti-parallel configuration of the two differential MEMS sensor devices 10, 20 of the twin MEMS transducer 30 is shown by showing their taps and used for simulation. As shown in FIG. 4, the MEMS transducer 30 used for simulation comprises two MEMS devices 10, 20 coupled in an anti-parallel manner as already described with respect to FIGS. 2 and 3. Furthermore, the acoustic sensing device is provided with a back volume 63. The geometry of the back volume 63 affects the acoustic quality of the acoustic sensing device 60, which will however not be discussed in further detail. Due to the anti-parallel configuration of the two differential MEMS sensor devices 10, 20 the signal read-out is performed in an anti-parallel manner. This is in contrast to a parallel configuration (not shown), where a parallel readout of each of the signal of a MEMS device 10, 20 is performed and where signal asymmetries are not cancelled but are superposed. The simulated read out signal obtained for a parallel setup (not shown) is presented in FIG. 5 and for an anti-parallel setup as shown in FIG. 4 is shown in FIG. 6.

The read-out signal is correlated to a signal asymmetry derived from the read-out signals. In general, a signal asymmetry may be defined as:

$$\text{Signal asymmetry} = \frac{(|outp| - |outn|)}{(0.5(|outp| + |outn|))}$$

wherein outp and outn are the signals read out at the outputs of the PGA 40 as shown in FIGS. 2 and 3 or read out at the output of the ASIC shown in FIG. 4. With respect to FIG. 4 the output are given by reading out the signals at the taps 18, 19, 28, 29, "12", and "22". The signal asymmetry that can be measured results from the capacitance asymmetry which in turn results from the gap asymmetry introduced above.

Figure 5:
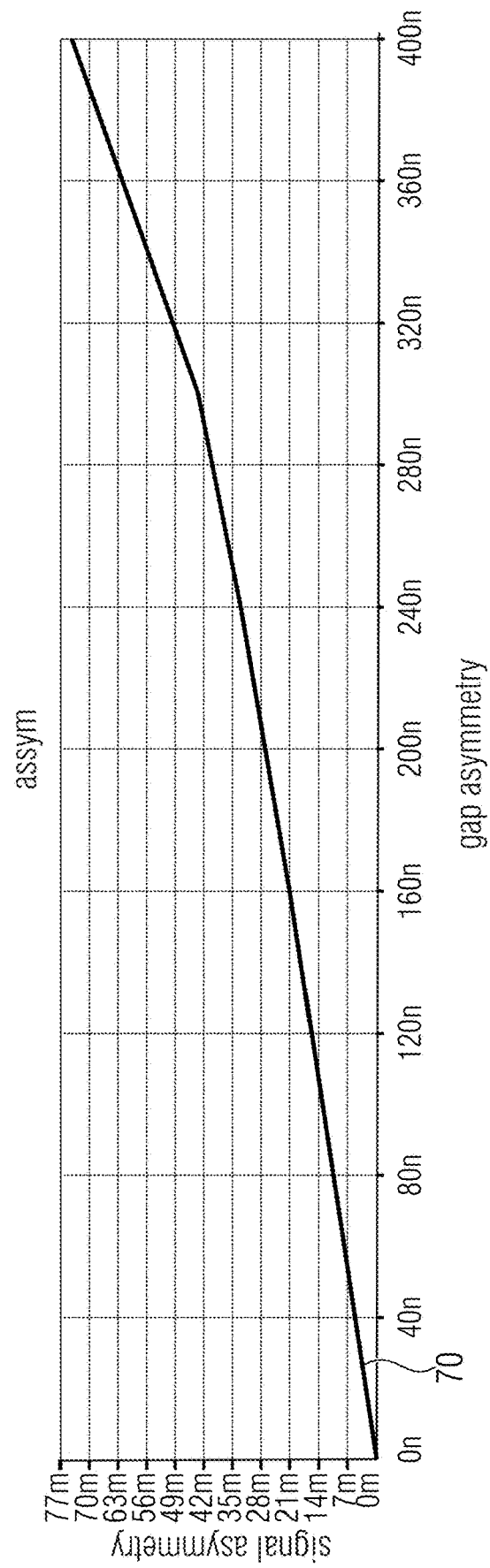
FIG. 5 illustrates a plot of a signal asymmetry as a function of a gap asymmetry of two MEMS sensor devices coupled in parallel.
Figure 6:
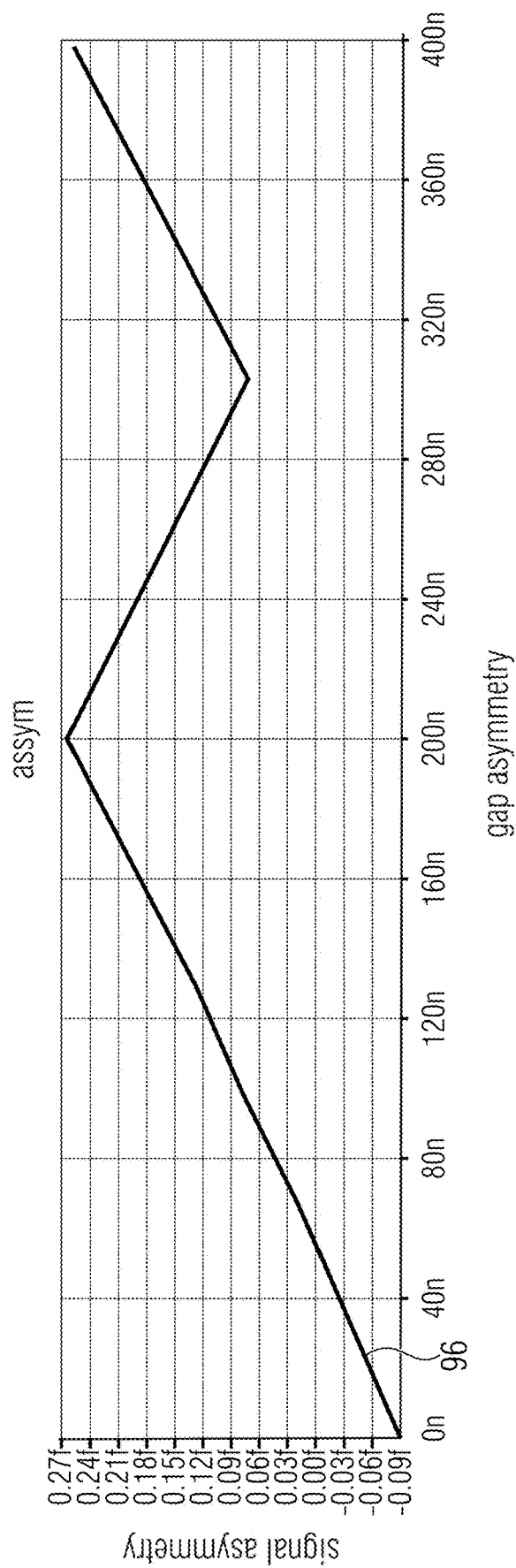
FIG. 6 illustrates a plot of a signal asymmetry as a function of a gap asymmetry for twin MEMS coupled in an anti-parallel manner.

FIG. 5 illustrates a plot of a signal asymmetry as a function of a gap asymmetry for two differential MEMS sensor devices coupled in parallel (not shown). If a differential MEMS sensor device 10, 20 has a gap asymmetry due to a fabrication deviation such a gaps asymmetry is about a few nanometers. The results presented herein are simulated results with a gap asymmetry of up to 400 nm. Thus, a gap asymmetry of 0 nm corresponds to differential MEMS sensor devices having no fabrication deviation. The plot 70 shown in FIG. 5, for example, is simulated for the case of a nominal gap of 1.8 µm of an acoustic sensing device as, for example a dual membrane microphone. If a gap asymmetry of 0 nm is assumed, the gap from the third electrode structure to the first electrode structure/first membrane is equal to 1.8 µm and the distance from the third electrode structure to the second electrode structure/second membrane is equal 1.8 µm. In the case of a gap asymmetry of 100 nm, 200 nm, 300 nm or 400 nm, the distance from the third electrode structure to the first electrode structure/first membrane decreases according to 1.8 µm–100 nm, 1.8 µm–200 nm, 1.8 µm–300 nm, or 1.8 µm–400 nm, whereas the distance from the third electrode structure to the second electrode structure/second membrane increases according to 1.8 µm+100 nm, 1.8 µM+200 nm, 1.8 µm+300 nm, or 1.8 µm+400 nm.

The signal asymmetry obtained for two differential MEMS sensor devices coupled in parallel shown in FIG. 5 indicates an increasing monotone function. For a gap asymmetry of 400 nm for example a signal asymmetry of about 71 is found, wherein the signal asymmetry is a ratio of the read out signals as defined above. This corresponds a to a signal asymmetry of up to 7% at a gap asymmetry of 400 nm. From the graph 70 shown in FIG. 5, it can be derived that in parallel configuration of the differential MEMS sensor devices 10, 20 and with increasing gap asymmetry of the differential MEMS sensor devices 10, 20 the resulting signal asymmetry is increasing. An increasing signal asymmetry, however, reduces the performance quality with respect to both, the acoustical performance and the robustness to the external environment.

FIG. 6 illustrates a graph 96 of a signal asymmetry as a function of a gap asymmetry for twin differential MEMS sensor devices coupled in an anti-parallel manner, wherein symmetric bias voltages are supposed without any offset, i.e. without any voltage error. Thus, it is assumed that $|+V_{mic}|=|-V_{mic}|$. The x-axes of FIGS. 5 and 6 are equal, both presenting a gap asymmetry between 0 and 400 nm. However, considering the y-axes of FIGS. 5 and 6, the ranges of the y-axes are quite different. As can be seen in in FIG. 6, the signal asymmetry shown in the y-axis reaches up to 0.27 femto units. Thus, the signal asymmetry is so to say zero at any value of a gap symmetry between 0 nm and 400 nm. This means a signal asymmetry of <<1% is obtained, if $|+V_{mic}|=|-V_{mic}|$, i.e. no voltage offset is considered. Thus, comparing the results shown in FIGS. 5 and 6, it is to be concluded that reading out the output signals in an anti-parallel configuration reduces the resulting signal asymmetry at an assumed gap asymmetry of 400 nm from 7% to less than <<1%. The graphs 70 and 96 shown in FIGS. 5 and 6 were simulated assuming that $|+V_{mic}|=|-V_{mic}|$.

Figure 7:
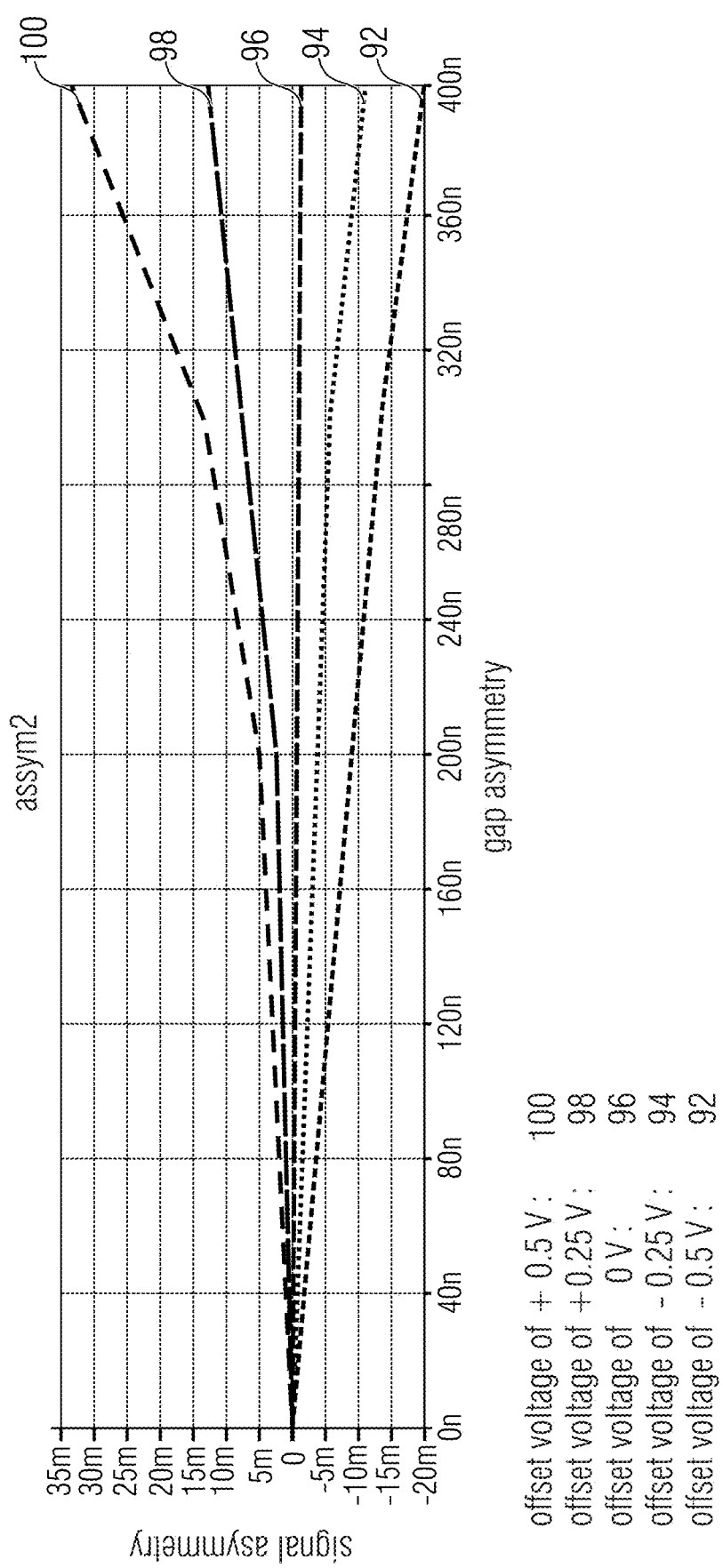
FIG. 7 illustrates a plot of a signal asymmetry as a function of a gap asymmetry for MEMS sensor devices coupled in an anti-parallel manner, wherein at least one of the biasing voltage sources has an voltage offset.

Again for a nominal gap of 1.8 µm the distance from the third electrode structure to the first electrode structure decreases while the distance from the third electrode structure to the second electrode structure increases. For obtaining the signal asymmetries as depicted in FIG. 7, two symmetric biasing voltage sources are assumed, wherein a voltage of an amount of 9V is assumed. The second biasing voltage source is assumed to suffer a voltage error.

However, even if it is considered that the bias voltage source is not to 100% symmetric, the capacitance cancellation is robust. FIG. 7 illustrates a plot showing graphs 92, 94, 96, 98, 100 of a signal asymmetry as a function of a gap asymmetry for differential MEMS sensor devices coupled in an anti-parallel manner, wherein at least one differential MEMS sensor device is coupled to a bias voltage source having a voltage offset of –0.5 V, –0.25 V, 0V, +0.5V, or +0.5 V. In particular, the graph 96 is simulated with a bias voltage offset of 0V and corresponds to the graph 96 as shown in FIG. 6. Because the range of they axes shown in FIG. 6 is different from the range of the y-axis shown in FIG. 7, the graph 96 shown in FIG. 7 corresponds to a horizontal straight line at a signal asymmetry of zero. The graph 92 shown in FIG. 7 is simulated assuming a bias voltage offset of –0.5V, and the graph 94 is simulated assuming a bias voltage offset of –0.25V. Assuming a negative bias voltage results in a negative signal asymmetry. The graph 98 is simulated assuming a bias voltage offset of +0.25V and the graph 100 is simulated assuming a bias voltage offset of +0.5V. Assuming a positive bias voltage results in a positive signal asymmetry.

The graph 100 illustrating the simulation result of a proposed MEMS transducer with anti-parallel configuration reveals the even at a gap asymmetry of 400 nm and an offset bias voltage of 0.5V a signal asymmetry of less than <3% is achieved. Thus, comparing the results shown in FIG. 5 with the results shown by graph 100 in FIG. 7, it is to be concluded that even with an offset bias voltage of +0.5V and at a gap asymmetry of 400 nm the resulting signal asymmetry of less than 3%, which is obtained for a MEMS transducer in anti-parallel configuration, is smaller than the resulting signal asymmetry of about 7%, which is obtained for a MEMS transducer in parallel configuration at a gap asymmetry of 400 nm and an offset bias voltage of 0V. In conclusion, even for an offset voltage of 0.5 V, the obtained signal asymmetry of the anti-parallel configuration is only as half as big as for a parallel configuration of the MEMS transducer.

Generally, as it can be recognized from FIG. 7, the greater the offset is, the greater the signal asymmetry at a signal gap of, for example 400 nm, is. However, even at an offset of +0.5 V shown in FIG. 7 and at a gap asymmetry of 400 nm the signal asymmetry of a twin differential MEMS sensor device as proposed is less than half the size of the signal asymmetry of two differential MEMS sensor devices coupled in a parallel configuration. Thus, for an anti-parallel configuration of the twin differential MEMS sensor device a signal asymmetry of less than <3% is obtained with a voltage offset of, for example, 0.5 V and a gap asymmetry of 400 nm. This means, the obtained signal readout is better for a voltage offset of 0.5 V of an antiparallel configuration of the twin MEMS device than for two MEMS devices coupled in parallel. It is to be noted that even for a bias voltage offset of 0.5 V and a gap asymmetry of 200 nm the signals asymmetry is smaller than <1%. It is to be noted, that as shown in FIG. 7 the graph 100 illustrates the greatest signal asymmetry obtained at a gap of 400 nm and an offset voltage value of 0.5V. This is why, this value is discussed on more detail, then the results obtained for an offset voltage value of −0.5V (graph 92), or −0.25V (graph 94), or 0V (graph 96), or +0.25V (graph 98) as also shown in FIG. 7.

Furthermore, an important consideration when using a MEMS based transducer, such as MEMS based microphones, is the response behavior of the MEMS transducer to mechanical or pressure shocks. Mechanical or pressure shock may be implemented by finger tapping at the MEMS transducer.

Figure 8:
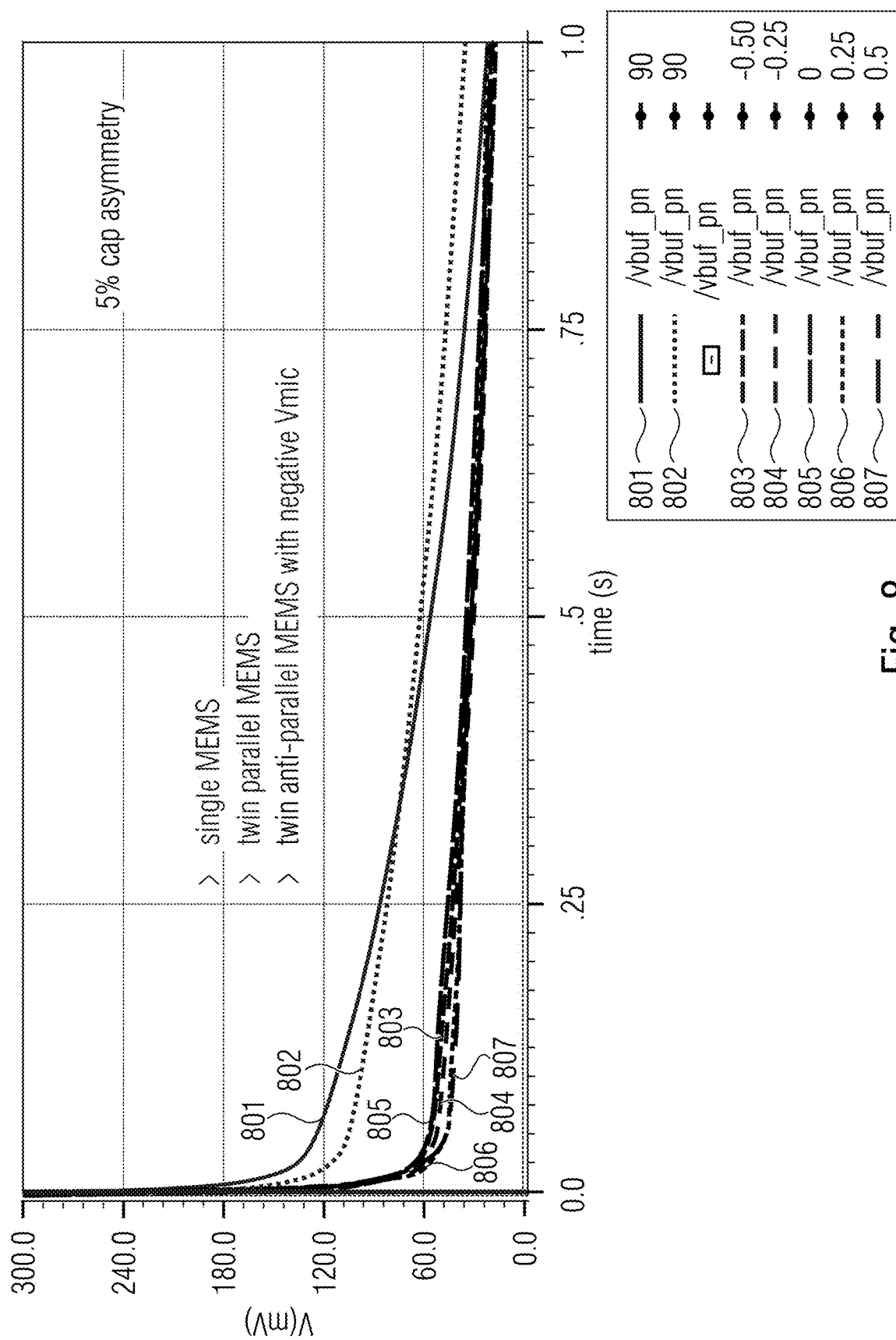
FIG. 8 illustrates a plot of a response to a shock, i.e. an output signal as a function of time for different configurations of the MEMS.

FIG. 8 illustrates a plot of a differential response to a shock, i.e. an output signal as a function of a time for different configurations of the MEMS based transducers. The graphs 801, 802, 803, 804, 805, 806, and 807 shown in FIG. 8 are simulated assuming a capacitance asymmetry of 5%. The graph 801 is simulated assuming only a single differential MEMS sensor device, while the graph 802 is simulated assuming two differential MEMS sensor devices coupled in parallel. Regarding the graphs 801 and 802, for example, it can be derived from FIG. 8 that a non-linearity of both, the differential MEMS sensor device(s) and the ASIC, create a response that has a slow decay to a normal balanced state. The going back to zero takes much longer for the graphs 801 and 802. After the first 0.25 sec the output signal of the graphs 801 and 802 is well above 80 mV.

The graphs 803 to 807 are simulated assuming two differential MEMS sensor devices coupled in an anti-parallel manner as disclosed herein. In particular, the graphs 803 to 807 are simulated assuming offset bias voltages ranging from −0.5V for graph 803, −0.25V for graph 804, 0V for graph 805, +0.25V for graph 806 and +0.5V for graph 807. It can be derived from FIG. 8 that, after 0.025 sec, the graphs 803 to 807 are all well below 60 mV. Furthermore, the graph 803 to 807 converge to a signal value of about 24 mV much quicker during 1 second than the graphs 801 and 802 do. The graph 802 (parallel configuration) reaches a value of 40 mV after 1 sec, while the graph 801 (single MEMS) reaches a value of 30 mV after 1 sec.

In conclusion, the graphs 803 to 807 (anti-parallel MEMS configuration) show an improved recovery behavior after a shock to the MEMS transducer has been applied, for example a finger tapping. The graphs 803 to 807 show an improved shock recovery behavior of more than 50% even at an offset bias voltage of ±0.5V and a capacitance asymmetry of 5%. From FIG. 8, it can be derived that the signal obtained in an anti-parallel configuration returns faster to zero than the signal obtained from a single differential MEMS sensor device or from differential MEMS sensor devices coupled in parallel. The comparison between the graphs 801, 802 and the graphs 803 to 807 proves the benefit of an anti-parallel configuration of a MEMS transducer as it could be shown that the anti-parallel configuration improves the robustness of the transducer when being exposed to a mechanical or pressure shock, for example a tap noise due to finger tapping.

Figure 9:
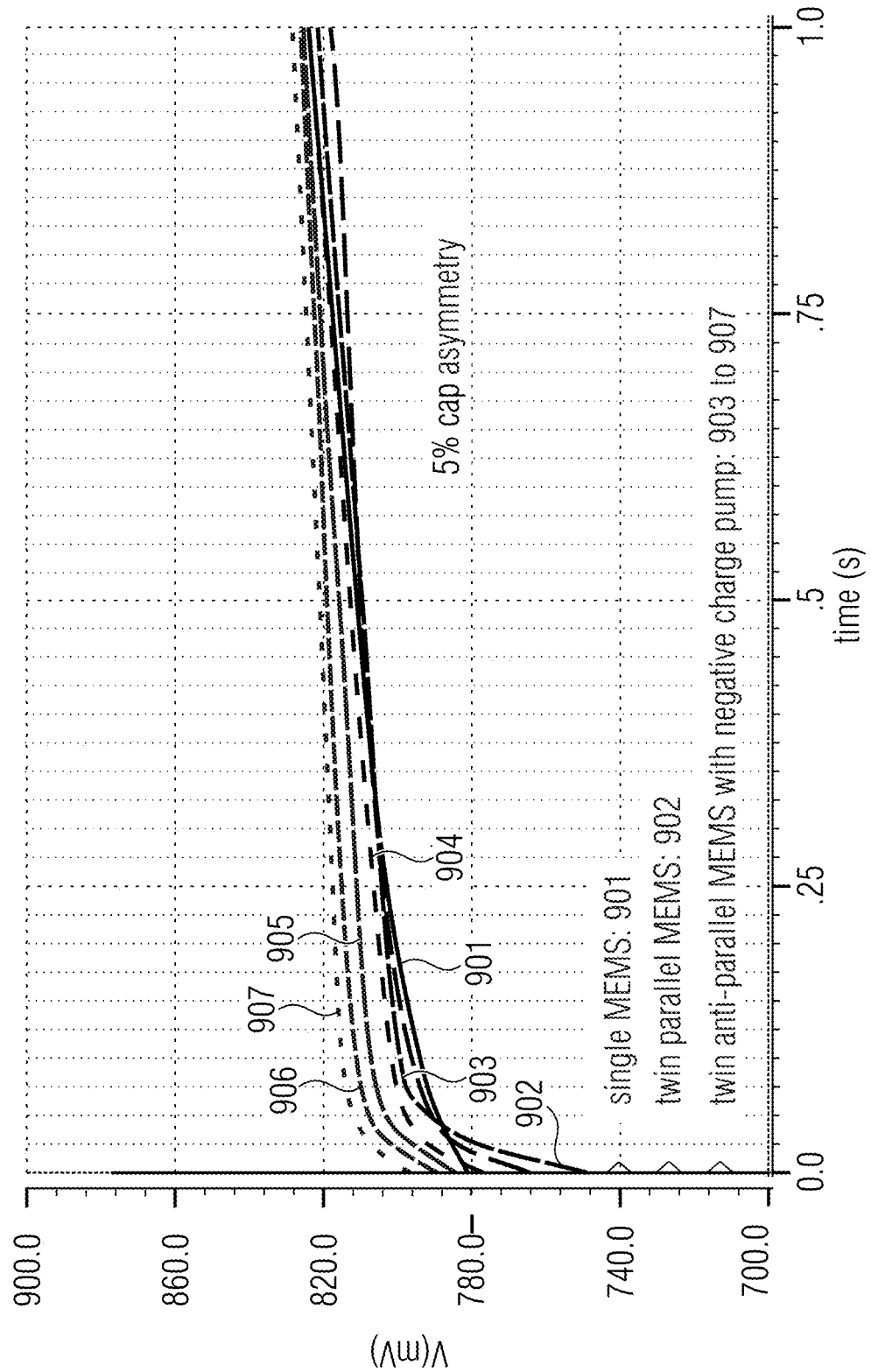
FIG. 9 illustrates a plot of a sensed signal as a function of time for different configurations of MEMS devices.

When considering the acoustical performance using a common mode voltage, it can be proven that the MEMS transducer with an anti-parallel configuration is beneficial. FIG. 9 illustrates a plot of a sensed responses as a function of time for different configurations of differential MEMS sensor devices. Similar to the simulation results presented in FIG. 8, for the simulation results presented in FIG. 9 a capacitance asymmetry of 5% is assumed. Also similar to FIG. 8, FIG. 9 presents a simulation result for a single differential MEMS sensor device in graph 901 and for two differential MEMS sensor devices in a parallel configuration in graph 902. Furthermore, FIG. 9 presents simulation results for a MEMS transducer comprising two differential MEMS sensor devices having an anti-parallel configuration. The graphs 903 to 907 are simulated applying a common mode voltage corresponding in their values to the offset bias voltages as used for simulating the graphs of FIG. 8, i.e. corresponding to offset bias voltages ranging from −0.5V for graph 903, −0.25V for graph 904, 0V for graph 905, +0.25V for graph 906 and +0.5V for graph 907. Each of the graphs 903 to 907 shows a logarithmic behavior. It can be derived from FIG. 9 that, by applying a common mode voltage, the signal response of graphs 903 to 907 reaches even faster a normal balanced state compared to the graphs 901 and 902. Thus, the MEMS transducer with anti-parallel configuration provides an improved acoustical performance when using a common mode voltage.

According to a further aspect of the embodiments of the present disclosure, a method of operating the MEMS transducer 30 described herein is disclosed. The method comprises providing a biasing voltage to each of the third electrode structures 12, 22 of the first and second differential MEMS sensor devices 10, 20, wherein the first and second bias voltages are symmetrically offset with respect to a, in particular common, reference voltage. Furthermore, the method comprises reading out a first differential and second differential output signal; and combining in an anti-parallel manner the first and the second differential output signal. The read out is performed by connecting a first output tap 18 of the first differential MEMS sensor device 10 and a second output tap 29 of the second differential MEMS sensor device 20, and by connecting a second output tap 19 of the first differential MEMS sensor device 10 and a first output tap 28 of the second differential MEMS sensor device 20.

FIG. 10 illustrates a flowchart of an embodiment of the method of operating a twin MEMS transducer having an anti-parallel configuration. A first step no is providing a MEMS transducer with an anti-parallel configuration of the at least two MEMS devices. It is possible to provide the MEMS arrangement as disclosed herein with plural pair of differential MEMS sensor devices, wherein the differential MEMS sensor devices of a pair are coupled in anti-parallel configuration. In step 120, a bias voltage is applied to each of the third electrode structures of the first and second differential MEMS sensor device of each pair of differential MEMS sensor devices. The bias voltages are applied to the third electrode structures such that the bias voltages are symmetric with respect to a reference voltage. For example, if for each third electrode structure a bias voltage source is provided, one of the third electrode structures may be provided with a positive bias voltage while the other of the third electrode structures may be provided with a corresponding negative voltage of the same or nearly the same absolute voltage value. For example, any voltages of ±8-12V may be applied to the third electrode structures. Other voltage values are also possible. For example, if a stacked bias voltage source is implemented in the MEMS transducer, then one of the electrode structures may be provided with a bias voltage $V_{mic}=0V$ and the other electrode structure of the pair of MEMS devices may be provided with twice the bias voltage $2*V_{mic}$ provided by the stacked bias voltage source. In this way, it can be avoided to apply negative bias voltages, and the applied positive bias voltages may be symmetric.

At step 130 a first and a second differential output signal are read out. As described with respect to FIGS. 2 and 3, for example, a PGA may be used, so that a first signal at a positive output of the PGA may be read out and a second signal at the negative output of the PGA may be read out. The read out is performed based on an anti-parallel configuration that is implemented by connecting a first output tap of the first differential MEMS sensor device 10 and a second output tap of the second differential MEMS sensor device 20, and by connecting a second output tap of the first differential MEMS sensor device 10 and a first output tap of the second differential MEMS sensor device 20. At step 140 the first and second output signals are combined. The combined signal results, for examples, in the signals as shown in FIGS. 6-9.

In the embodiments of the present disclosure, a capacitance asymmetry may be cancelled, which improves for example the small signals and/or the large signal responses outputted by the MEMS transducer, in particular by the acoustic sensing device such as a microphone. Stated differently, by reading out the signals using an anti-parallel configuration of the paired differential MEMS sensor devices a capacitance asymmetry may be canceled so that the signal-to-noise ratio may be improved.

Example embodiments of the present concept are summarized here. Other embodiments can also be understood from the entirety of the specification and the claims filed herein.

Example 1

A MEMS transducer 30, comprising:
a first and a second differential MEMS sensor device 10, 20, wherein the first differential MEMS sensor device 10 comprises a first and a second electrode structure 14, 16 for providing a first differential output signal, and a third electrode structure 12 between the first and second electrode structure 14, 16; wherein the second differential MEMS sensor device 20 comprises a first and second electrode structure 24, 26 for providing a second differential output signal, and a third electrode structure 22 between the first and second electrode structure 24, 26, a biasing circuit 11 for providing the third electrode structure 12 of the first differential MEMS sensor device 10 with a first biasing voltage and for providing the third electrode structure 22 of the second differential MEMS sensor device 20 with a second biasing voltage, in that the first and second biasing voltages are symmetrically offset with respect to a reference voltage, and a read-out circuitry 15, 17, 40 configured to combine the first and second differential output signal in an anti-parallel manner.

Example 2

The MEMS transducer 30 as in example 1, wherein the MEMS transducer 30 comprises a dual membrane configuration, wherein the first electrode structure 14, 24 is a first membrane and the second electrode structure 16, 26 is a second membrane, and wherein the third electrode structure 12, 22 is a backplate.

Example 3

The MEMS transducer 30 as in example 1, wherein the MEMS transducer comprises a dual backplate configuration, wherein the first electrode structure 14, 24 is a first backplate and the second electrode structure 16, 26 is a second backplate, and wherein the third electrode structure 12, 22 is a membrane.

Example 4

The MEMS transducer 30 as in one of examples 1-3, wherein the first and the second differential MEMS sensor devices 10, 20 are identically constructed apart from manufacturing deviations, and wherein the first and the second differential MEMS sensor devices 10, 20 are having a twin configuration.

Example 5

The MEMS transducer 30 as in one of examples 1-4, wherein the first differential output signal is provided between a first and a second output tap 18, 19 of the first differential MEMS sensor device 10 and the second differential output signal is provided between a first and a second output tap 28, 29 of the second differential MEMS sensor device 20, wherein the first output tap 18 of the first differential MEMS sensor device 10 is connected with the first electrode structure 14 of the first differential MEMS sensor device 10, and the second output tap 19 of the first differential MEMS sensor device 10 is connected with the second electrode structure 16 of the first differential MEMS sensor device 10, and wherein the first output tap 28 of the second differential MEMS sensor device 20 is connected with the first electrode structure 24 of the second differential MEMS sensor device 20, and the second output tap 29 of the second differential MEMS sensor device 20 is connected with the second electrode structure 26 of the second differential MEMS sensor device 26; and wherein a read out of a combined first and second differential output signal is provided by an anti-parallel connection 15, 17 of the first and second output taps 18, 19, 28, 29 of the first and second differential MEMS sensors 10, 20.

Example 6

The MEMS transducer 30 as in example 5, wherein combining in an anti-parallel manner the first and the second differential output signal comprises to connect the first output tap 18 of the first differential MEMS sensor device 10 and the second output tap 29 of the second differential MEMS sensor device 20, and comprises to connect the second output tap 19 of the first differential MEMS sensor device 10 and the first output tap 28 of the second differential MEMS sensor device 20.

Example 7

The MEMS transducer 30 as in one of examples 1-6, wherein the first biasing voltage is a positive voltage, and the second biasing voltage is a negative voltage, wherein the first and the second biasing voltage are having the same absolute voltage value, and the reference voltage is a ground voltage.

Example 8

The MEMS transducer 30 as in one of examples 1-6, wherein one of the bias voltage sources 61, 62 is a stacked bias voltage source 44 having an AC coupling, in particular the stacked bias voltage source 44 having an AC coupling is configured to provide positive first biasing voltage and a positive second biasing voltage, wherein the first and second biasing voltages are symmetric with respect to a positive reference voltage.

Example 9

The MEMS transducer 30 as in one of examples 1-8, wherein the read out circuitry 15, 17, 40 comprises a programmable gain amplifier (PGA) designed for amplifying the combined anti-parallel signal.

Example 10

The MEMS transducer 30 as in one of examples 1-9, wherein two or more pairs of differential MEMS sensor devices 10, 20 coupled in a twin configuration are coupled with each other in an anti-parallel manner, and are providing a sensor output signal having a reduced signal asymmetry resulting from capacitance asymmetries of the first and second differential MEMS sensor device 10, 20.

Example 11

An acoustic sensing device 60 comprising: a housing 61; a sound port 52 having a sound port inlet 54 for letting pass sound waves to an interior of the acoustic sensing device 60; and a MEMS transducer 30 according to one of examples 1 to 10.

Example 12

The acoustic sensing device of example 11, wherein at least one pair of the one or more pairs of differential MEMS sensor devices is a pair of MEMS microphones.

Example 13

Method of operating the MEMS transducer 30 as in one of examples 1-10, comprising:
providing a biasing voltage to each of the third electrode structures 12, 22 of the first and second differential MEMS sensor devices 10, 20, wherein the first and second biasing voltages are symmetrically offset with respect to a, in particular common, reference voltage, and reading out a first differential and second differential output signal; and
combining in an anti-parallel manner the first and the second differential output signal by connecting a first output tap of the first differential MEMS sensor device 10 and a second output tap of the second differential MEMS sensor device 20, and by connecting a second output tap of the first differential MEMS sensor device 10 and a first output tap of the second differential MEMS sensor device 20.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

In the foregoing detailed description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, subject matter may lie in less than all features of a single disclosed example. Thus, the following claims are hereby incorporated into the detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

While the embodiments have been described with reference to illustrative embodiments, this disclosure is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. MEMS transducer, comprising:
at least one pair of differential MEMS sensor devices,
wherein a first differential MEMS sensor device comprises a first and a second electrode structure for providing a first differential output signal, and a third electrode structure between the first and second electrode structure,
wherein a second differential MEMS sensor device comprises a first and second electrode structure for providing a second differential output signal, and a third electrode structure between the first and second electrode structure,
a biasing circuit for providing the third electrode structure of the first differential MEMS sensor device with a first biasing voltage and for providing the third electrode structure of the second differential MEMS sensor device with a second biasing voltage, in that the first and second biasing voltages are symmetrically offset with respect to a reference voltage, and a read-out circuitry configured to combine the first and second differential output signal in an anti-parallel manner to provide a combined anti-parallel signal, wherein the read-out circuitry comprises a differential amplifier having a positive input and a negative input, wherein the first electrode structure of the first differential MEMS sensor device is coupled to the positive input and the second electrode structure of the first differential MEMS sensor device is coupled to the negative input, wherein the first electrode structure of the second differential MEMS sensor device is coupled to the negative input and the second electrode structure of the second differential MEMS sensor device is coupled to the positive input, and wherein the differential amplifier includes a differential output configured for providing a third differential output signal.

2. The MEMS transducer according to claim 1, wherein the MEMS transducer comprises a dual membrane configuration, wherein the first electrode structure is a first membrane and the second electrode structure is a second membrane, and wherein the third electrode structure is a backplate.

3. The MEMS transducer according to claim 1, wherein the MEMS transducer comprises a dual backplate configuration, wherein the first electrode structure is a first backplate and the second electrode structure is a second backplate, and wherein the third electrode structure is a membrane.

4. The MEMS transducer according to claim 1, wherein the first and the second differential MEMS sensor devices are identically constructed apart from manufacturing deviations, and wherein the first and the second differential MEMS sensor devices are arranged in a twin configuration.

5. The MEMS transducer according to claim 1, wherein
the first differential output signal is provided between a first and a second output tap of the first differential MEMS sensor device and the second differential output signal is provided between a first and a second output tap of the second differential MEMS sensor device, wherein
the first output tap of the first differential MEMS sensor device is connected with the first electrode structure of the first differential MEMS sensor device, and the second output tap of the first differential MEMS sensor device is connected with the second electrode structure of the first differential MEMS sensor device, and wherein
the first output tap of the second differential MEMS sensor device is connected with the first electrode structure of the second differential MEMS sensor device, and the second output tap of the second differential MEMS sensor device is connected with the second electrode structure of the second differential MEMS sensor device; and wherein
a read out of a combined first and second differential output signal is provided by an anti-parallel connection of the first and second output taps of the first and second differential MEMS sensor devices.

6. The MEMS transducer according to claim 5, wherein the anti-parallel combination of the first and the second differential output signal comprises connecting the first output tap of the first differential MEMS sensor device and the second output tap of the second differential MEMS sensor device, and comprises connecting the second output tap of the first differential MEMS sensor device and the first output tap of the second differential MEMS sensor device.

7. The MEMS transducer according to claim 1, wherein the first biasing voltage is a positive voltage, and the second biasing voltage is a negative voltage, wherein the first and the second biasing voltage have a same absolute voltage value, and the reference voltage is a ground voltage.

8. The MEMS transducer according to claim 1, further comprising a stacked bias voltage source configured to provide a positive first biasing voltage and a positive second biasing voltage, wherein the first and second biasing voltages are symmetric with respect to a positive reference voltage.

9. The MEMS transducer according to claim 1, wherein the read-out circuitry comprises a programmable gain amplifier designed for amplifying the combined anti-parallel signal.

10. The MEMS transducer according to claim 1, wherein two or more pairs of differential MEMS sensor devices coupled in a twin configuration are coupled with each other in an anti-parallel manner, and are configured for providing a sensor output signal having a reduced signal asymmetry resulting from capacitance asymmetries of the first and second differential MEMS sensor device.

11. An acoustic sensing device comprising:
a housing;
a sound port having a sound port inlet for letting pass sound waves to an interior of the acoustic sensing device; and
a MEMS transducer according claim 1.

12. The acoustic sensing device of claim 11, wherein at least one pair of the one or more pair of differential MEMS sensor devices is a pair of MEMS acoustic transducers.

13. A method of operating a MEMS transducer according to claim 1, comprising:
providing a biasing voltage to each of the first, second, and third electrode structures of the first and second differential MEMS sensor devices, wherein the first and second biasing voltages are symmetrically offset with respect to a common reference voltage, and
reading out a first differential and second differential output signal by connecting a first output tap of the first differential MEMS sensor device and a second output tap of the second differential MEMS sensor device, and by connecting a second output tap of the first differential MEMS sensor device and a first output tap of the second differential MEMS sensor device; and
combining the first and the second differential output signal in an anti-parallel manner.

14. The MEMS transducer according to claim 1, further comprising:
a first bias resistor having a first terminal coupled to the positive input; and
a second bias resistor having a first terminal coupled to the negative input.

15. The MEMS transducer according to claim 14, wherein the first bias resistor has a second terminal coupled to ground, and wherein the second bias resistor has a second terminal coupled to ground.

16. The MEMS transducer according to claim 14, further comprising:
a first capacitor interposed between the positive input and the first electrode structure of the first differential MEMS sensor device, and
a second capacitor interposed between the negative input and the second electrode structure of the first differential MEMS sensor device.

17. The MEMS transducer according to claim 16, further comprising:

a third bias resistor having a first terminal coupled to the first electrode structure of the first differential MEMS sensor device; and a fourth bias resistor having a first terminal coupled to the second electrode structure of the first differential MEMS sensor device.

18. The MEMS transducer according to claim 17, wherein the third bias resistor has a second terminal coupled to a third biasing voltage, and wherein the fourth bias resistor has a second terminal coupled to the third biasing voltage.

19. The MEMS transducer according to claim 18, wherein the third biasing voltage is different from the first and second biasing voltages.

20. The MEMS transducer according to claim 19, wherein the third biasing voltage has a value that is one half that of the first biasing voltage.

* * * * *

UNITED STATES PATENT AND TRADEMARK OFFICE
CERTIFICATE OF CORRECTION

PATENT NO. : 11,381,923 B2
APPLICATION NO. : 16/884816
DATED : July 5, 2022
INVENTOR(S) : Andreas Wiesbauer et al.

Page 1 of 1

It is certified that error appears in the above-identified patent and that said Letters Patent is hereby corrected as shown below:

In the Claims

Claim 1, Column 18, Line 49; insert --A-- before "MEMS".

Signed and Sealed this
Sixth Day of September, 2022

Katherine Kelly Vidal
*Director of the United States Patent and Trademark Office*